United States Patent
van Liempd et al.

(10) Patent No.: US 9,948,446 B2
(45) Date of Patent: Apr. 17, 2018

(54) TELECOMMUNICATIONS DEVICE COMPRISING AN ELECTRICAL BALANCE DUPLEXER AND METHOD FOR BALANCING THE ELECTRICAL BALANCE DUPLEXER

(71) Applicants: IMEC VZW, Leuven (BE); Vrije Universiteit Brussel, Brussel (BE)

(72) Inventors: Barend Wilhelmus Marinus van Liempd, Leuven (BE); Benjamin Hershberg, Leuven (BE); Nathalie Fievet, Anhee (BE)

(73) Assignees: IMEC VZW, Leuven (BE); Vrije Universiteit Brussel, Brussels (BE)

( * ) Notice: Subject to any disclaimer, the term of this patent is extended or adjusted under 35 U.S.C. 154(b) by 20 days.

(21) Appl. No.: 15/292,370

(22) Filed: Oct. 13, 2016

(65) Prior Publication Data

US 2017/0187510 A1 Jun. 29, 2017

(30) Foreign Application Priority Data

Dec. 24, 2015 (EP) .................................. 15202762

(51) Int. Cl.
H04L 5/14 (2006.01)
H04B 7/04 (2017.01)
(Continued)

(52) U.S. Cl.
CPC .................. *H04L 5/14* (2013.01); *H03H 7/40* (2013.01); *H03H 7/463* (2013.01);
(Continued)

(58) Field of Classification Search
None
See application file for complete search history.

(56) References Cited

U.S. PATENT DOCUMENTS 5,159,703 A * 10/1992 Lowery .................. G11B 20/02
381/73.1
9,083,441 B2 * 7/2015 Sahota .................... H04B 1/581
(Continued)

FOREIGN PATENT DOCUMENTS

| EP | 2 672 631 A1 | 11/2013 |
| WO | 2013/063506 A2 | 5/2013 |
| WO | 2014/173459 A1 | 10/2014 |

OTHER PUBLICATIONS

European Search Report, European Patent Application No. 15202762, dated Jun. 9, 2016, 4 pages.
(Continued)

*Primary Examiner* — Bunjob Jaroenchonwanit
(74) *Attorney, Agent, or Firm* — McDonnell Boehnen Hulbert & Berghoff LLP

(57) ABSTRACT

The present disclosure relates to a telecommunications device. The telecommunications device includes an electrical balance duplexer connected to an output node of a transmission path, an input node of a receive path, an antenna, and a tunable impedance. The electrical balance duplexer is configured to isolate the transmission path from the receive path by tuning the tunable impedance. The telecommunications device also includes a tuning circuit for tuning the tunable impedance. The tuning circuit includes amplitude detectors for measuring voltage amplitudes, phase detectors for measuring voltage phase differences, an impedance sensor for measuring an input impedance of the electrical balance duplexer, and a processing unit operatively connected to the detectors, the impedance sensor, and the tunable impedance. The processing unit is configured to calculate an optimized impedance value. The processing unit is also configured to tune the tunable impedance towards the optimized impedance value.

20 Claims, 8 Drawing Sheets

(51) Int. Cl.
*H04B 15/00* (2006.01)
*H03H 7/46* (2006.01)
*H03H 7/40* (2006.01)
*H04B 1/525* (2015.01)

(52) U.S. Cl.
CPC .......... *H04B 7/0469* (2013.01); *H04B 15/00* (2013.01); *H04B 1/525* (2013.01)

(56) References Cited

U.S. PATENT DOCUMENTS

| | | | |
|---|---|---|---|
| 9,667,404 B2* | 5/2017 | Sjoland | H04B 1/109 |
| 2013/0343237 A1* | 12/2013 | Mikhemar | H04B 1/18 370/278 |
| 2014/0176388 A1* | 6/2014 | Van Liempd | H01Q 1/50 343/861 |
| 2016/0294436 A1* | 10/2016 | Din | H04B 1/109 |
| 2017/0187510 A1* | 6/2017 | van Liempd | H04L 5/14 |

OTHER PUBLICATIONS

Laughlin, Leo et al., "Passive and Active Electrical Balance Duplexers", IEEE Transactions on Circuits and Systems—II: Express Briefs, vol. 63, No. 1, Jan. 2016, pp. 94-98.

* cited by examiner

TELECOMMUNICATIONS DEVICE COMPRISING AN ELECTRICAL BALANCE DUPLEXER AND METHOD FOR BALANCING THE ELECTRICAL BALANCE DUPLEXER

CROSS-REFERENCE TO RELATED APPLICATIONS

The present application is a non-provisional patent application claiming priority to European Patent Application No. EP 15202762.9, filed Dec. 24, 2015, the contents of which are hereby incorporated by reference.

FIELD OF THE DISCLOSURE

The present disclosure relates to a telecommunications device comprising an electrical balance duplexer and a tuning circuit for tuning a tunable impedance of the electrical balance duplexer. The present disclosure also relates to a method for tuning the tunable impedance of the telecommunications device.

BACKGROUND

An electrical balance duplexer (EBD) is a tunable RF frontend concept that addresses some of the key challenges of 4G and 5G mobile systems. The basic principle of the EBD is shown in FIG. 1. Duplexer isolation is achieved when the signals in paths 1 and 2 cancel and prevent the signal TX from appearing at the RX port. This cancellation is achieved by balancing the antenna port's impedance $Z_{ANT}$ with a tunable on-chip impedance $Z_{BAL}$, hence the name "electrical balance".

Wireless devices now support an increasing number of 4G FDD bands, and a tunable integrated solution like this could potentially replace several fixed-frequency filters and switches. The EBD is also attractive for 5G in-band full-duplex (FD) communication systems. Whereas a filtering-based duplexer cannot isolate the TX and RX ports for the special case where $f_{TX}=f_{RX}$, the EBD's signal cancellation approach still works.

However, the entire EBD concept depends on the capability to tune $Z_{BAL}$ into balance with $Z_{ANT}$. This needs to happen not just at a single frequency, but across the entire bandwidth of both the TX and RX channels. Additionally, the impedance characteristic of the antenna will vary significantly over time due to interaction with the user and environment. Therefore, it is necessary to provide the EBD with a system for matching of the tunable impedance $Z_{BAL}$ to the antenna port's impedance $Z_{ANT}$.

A solution for tuning the tunable impedance is shown in FIG. 2. Here, a hybrid transformer of the EBD is represented as a 4-port circuit element. In clockwise order starting from the left side, the ports of the EBD are connected to the antenna, the low-noise amplifier (LNA, not shown) of the RX-chain, $Z_{BAL}$ and the power amplifier (PA, not shown) of the TX-chain. A tuner is provided on the antenna side for reducing antenna impedance variations present under environmental disturbances near the antenna near-field. With reduced variations, it is more feasible to tune the balance network to track the remaining variation and optimize the balance condition while simultaneously optimizing the PA efficiency.

Hybrid couplers connected to $V_{X+}$ and $V_{X-}$ are subsequently connected to amplitude and phase difference detectors that can measure the waves moving back and forth between the hybrid transformer and the load port (e.g. RX, BAL, PA, and ANT). In this way, it is possible to measure all transfer functions from any port to any other port. Such transfer functions can be captured in so-called S-parameters. The following generic 4-port matrix would define the transfer characteristics according to the waves that such a hybrid coupler-based sensing system can observe:

$$\begin{bmatrix} b_1 \\ b_2 \\ b_3 \\ b_4 \end{bmatrix} = \begin{bmatrix} S_{11} & S_{12} & S_{13} & S_{14} \\ S_{21} & S_{22} & S_{23} & S_{24} \\ S_{31} & S_{23} & S_{33} & S_{34} \\ S_{41} & S_{24} & S_{34} & S_{44} \end{bmatrix} \begin{bmatrix} a_1 \\ a_2 \\ a_3 \\ a_4 \end{bmatrix},$$

where $a_i$ and $b_i$, are the waves as defined by S-parameter theory for all ports, and port 1 is the ANT port, port 2 the PA/TX port, port 3 is the $Z_{BAL}$ port, and port 4 is the LNA/RX port.

A strategy is to observe all scattering parameters (S-parameters), and calculate from all those parameters the reflection required at the BAL port that will provide electrical balance, from which the BAL impedance needed for electrical balance can also be derived. For any given time instant, under the assumption that the antenna remains constant during a sufficiently long period in time for the algorithm to run, the waves are used to derive S-parameters, giving direct system-state information that can concurrently be used to calculate the optimized $Z_{BAL}$ that enables signal cancellation of a signal generated in the PA/TX.

This solution has the disadvantage that it is complex in design, and thus expensive to implement. Furthermore, the couplers have the disadvantage of being large components which are lossy when integrated on typical silicon technologies. This solution also does not allow for real-time balancing of the electrical balance duplexer, as it requires reducing antenna impedance variations before calculation of all the S-parameters requires tuning of both the antenna's port impedance and the tunable impedance.

Another solution for balancing an electrical balance duplexer is shown in WO 2013/063506 A2. This solution is also complex in design and requires the tuning of an antenna impedance and a tunable impedance.

SUMMARY

It is an aim of the present disclosure to provide embodiments for impedance balancing in a telecommunications device having an electrical balance duplexer.

This aim is achieved according to the present disclosure with a telecommunications device showing the technical characteristics of the characterizing part of the first claim.

Therefore, the present disclosure provides a telecommunications device comprising an electrical balance duplexer and a tuning circuit. The electrical balance duplexer is connected to an output node of a transmission path, to an input node of a receive path, to an antenna and to a tunable impedance. The electrical balance duplexer is configured to isolate the transmission path from the receive path by tuning the tunable impedance. The tuning circuit is provided for tuning the tunable impedance. The tuning circuit comprises amplitude detectors for measuring a voltage amplitude at each of the connections between the electrical balance duplexer on the one hand and the transmission path, the receive path and the tunable impedance on the other hand. The tuning circuit comprises phase detectors for measuring a voltage phase difference between any two of the connections between the electrical balance duplexer on the one hand and the transmission path, the receive path and the tunable impedance on the other hand. Hence, the tuning circuit comprises a phase detector for measuring a voltage phase difference between on the one hand the connection between the electrical balance duplexer and the transmission path and on the other hand the connection between the electrical balance duplexer and the tunable impedance, another phase detector for measuring a voltage phase difference between on the one hand the connection between the electrical balance duplexer and the transmission path and on the other hand the connection between the electrical balance duplexer and the receive path, and yet another measuring a voltage phase difference between on the one hand the connection between the electrical balance duplexer and the receive path and on the other hand the connection between the electrical balance duplexer and the tunable impedance. The tuning circuit comprises an impedance sensor for measuring the input impedance of the electrical balance duplexer at the connection between the electrical balance duplexer and the tunable impedance. The tuning circuit comprises a processing unit operatively connected to the detectors and to the tunable impedance. The processing unit is configured for calculating an optimized impedance value from the voltage amplitudes, the voltage phase differences and the impedance measured by the detectors. The processing unit is configured for tuning the tunable impedance towards the optimized impedance value.

In an example embodiment, the output of these detectors is sufficient to derive an approximation of the complete system of the electrical balance duplexer, and thus is sufficient to calculate an optimized impedance value for the tunable impedance, or at least a good first estimate for the optimized impedance value. This can allow the design of the tuning circuit to be greatly simplified, which can make the telecommunications device according to the present disclosure less expensive and more energy efficient and as such provide comparatively better RF performance.

The limited amount of data for the calculation of the optimized impedance value also permits the optimized impedance value of the tunable impedance to be calculated quickly, thereby enabling real-time tuning of the tunable impedance and thus balancing of the electrical balance duplexer. This also permits an inexpensive processing unit to be used for calculating the optimized impedance value, thereby further reducing the costs and energy consumption of the telecommunications device according to the present disclosure.

It is understood that the amplitude detectors, the phase detectors and the impedance detector may be implemented in different ways. They may for example be implemented as independent sensing circuits or elements which directly provide the amplitude, phase difference and impedance information to the processing unit. They may however, as another example, also be implemented by means of independent voltage detectors at each of the connections between the electrical balance duplexer on the one hand and the transmission path, the receive path and the tunable impedance on the other hand. Then, the processing unit may be provided for calculating the amplitude, phase difference and impedance information from the voltages detected by the voltage detectors.

In an embodiment of the telecommunications device according to the present disclosure the processing unit is configured for calculating the optimized impedance value from at least four scattering parameters between any two of the transmission path, the receive path and the tunable impedance. In some embodiments, the processing unit is configured for calculating the optimized impedance value from four scattering parameters, between any two of the transmission path, the receive path and the tunable impedance. The scattering parameters are calculated from the voltage amplitudes, the voltage phase differences and the impedance measured by the detectors.

In an example embodiment, a limited or reduced set of scattering parameters (S-parameters) can serve as an approximation of the complete S-parameter system of equations and thus be sufficient to calculate an optimized impedance value for the tunable impedance, or at least a good first estimate for the optimized impedance value. Furthermore, in some embodiments, this limited set of S-parameters may be approximated using amplitude and phase information from the detectors of the tuning circuit according to the present disclosure. This can allow the design of the tuning circuit to be greatly simplified, which can make the telecommunications device according to the present disclosure less expensive and more energy efficient and as such provide comparatively better RF performance.

Reducing the number of scattering parameters that are used for calculating an optimized impedance value increases the speed with which the optimized impedance value can be calculated, and thus improves upon the ability of the communications device to perform real-time tuning of the tunable impedance and thus balancing of the electrical balance duplexer.

In an embodiment of the telecommunications device according to the present disclosure the processing unit is configured for iteratively calculating the optimized impedance value and tuning the tunable impedance towards the optimized impedance value.

In an example embodiment, any difference between the first calculation of the optimized impedance value and a true optimized impedance value, caused by any approximations made in the equations for calculating the optimized impedance value, may be reduced quickly by iteratively repeating the tuning of the tunable impedance based on the amplitude and phase data obtained by the same detectors. In this way, the use of additional components for further improving the tuning of the tunable impedance to the optimized impedance value, can be avoided.

Because of the simplification in the calculation of the optimized impedance value, these iterative calculations are performed quickly, such that the further tuning of the tunable impedance and thereby balancing of the electrical balance duplexer may still be performed in real-time.

In some embodiments, the tuning of the tunable impedance is repeated until the scattering parameter from the transmission path to the receive path, which is an indicator for isolation of the transmission path from the receive path and may be calculated from the amplitude and phase data from the amplitude and phase detectors at the transmission path and the receive path, is below a predetermined threshold value.

In an embodiment of the telecommunications device according to the present disclosure, at least one of the detectors is implemented by means of a root mean square (rms) voltage detector.

Implementing the detectors of the telecommunications device according to an embodiment of the present disclosure by means of rms voltage detectors, instead of more bulky and/or lossy components, can permit a further simplifying of the design of the communications device.

In an embodiment of the telecommunications device according to the present disclosure, the impedance detector is implemented by means of the amplitude detector at the connection between the electrical balance duplexer and the tunable impedance, for example in combination with voltage phase detecting means for detecting the voltage phase at the connection, a power source for providing a reference current, and optionally additional phase detecting means for detecting the phase of the reference current.

In an example embodiment, the impedance detector of the tuning circuit may be implemented by means of a power source providing a reference current and the amplitude detector at the connection between the electrical balance duplexer and the tunable impedance in combination with phase detecting means for detecting the voltage phase at the connection, and optionally also phase detecting means for detecting a phase of the reference current. If the tunable impedance is then temporarily disconnected, then the input impedance of the electrical balance duplexer at the connection between the electrical balance duplexer and the tunable impedance is easily calculated from the reference current and the measured amplitude and phase data. The use of the same detector can allow further simplifying the design of the circuit.

The present disclosure further provides a method for tuning a tunable impedance of a telecommunications device comprising an electrical balance duplexer. The electrical balance duplexer of the telecommunications device is connected to an output node of a transmission path, to an input node of a receive path, to an antenna and to the tunable impedance. The electrical balance duplexer is configured to isolate the transmission path from the receive path by tuning the tunable impedance. The method comprises the step of measuring a voltage amplitude at each of the connections between the electrical balance duplexer on the one hand and the transmission path, the receive path and the tunable impedance on the other hand. The method comprises the step of measuring a voltage phase difference between any two of the connections between the electrical balance duplexer on the one hand and the transmission path, the receive path and the tunable impedance on the other hand. The method comprises the step of measuring an input impedance of the electrical balance duplexer at the connection between the electrical balance duplexer and the tunable impedance. The method comprises the step of calculating an optimized impedance value from the measured voltage amplitudes, voltage phase differences and impedance. The method comprises the step of tuning the tunable impedance towards the optimized impedance value.

For the discussion of the method according to the present disclosure there is referred to the discussion of the telecommunications device according to the present disclosure.

In an embodiment of the method according to the present disclosure the optimized impedance value is calculated from at least four scattering parameters between any two of the transmission path, the receive path and the tunable impedance. The scattering parameters are calculated from the measured voltage amplitudes, voltage phase differences and impedance.

In an embodiment of the method according to the present disclosure the steps of the method are iteratively repeated until a scattering parameter from the transmission path to the receive path is below a predetermined threshold value.

The scattering parameter is calculated from the measured voltage amplitudes at the connection between the electrical duplexer on the one hand and the transmission path and the receive path on the other hand, and from the measured voltage phase difference between the connections between the electrical duplexer on the one hand and the transmission path and the receive path on the other hand.

In an embodiment of the method according to the present disclosure the method is provided for tuning the tunable impedance of the telecommunications device according to an embodiment of the present disclosure.

BRIEF DESCRIPTION OF THE FIGURES

The disclosure will be further elucidated by means of the following description and the appended figures.

DETAILED DESCRIPTION

Figure 1:
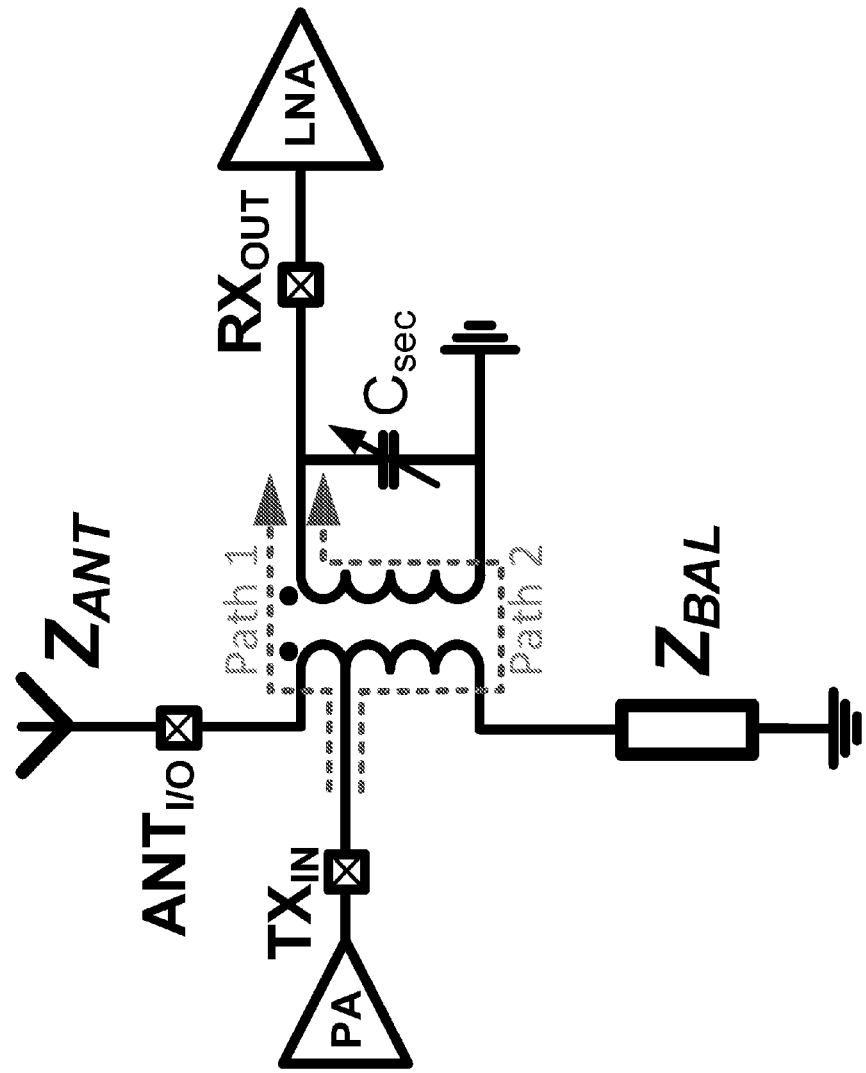
FIG. 1 shows an electrical balance duplexer.
Figure 2:
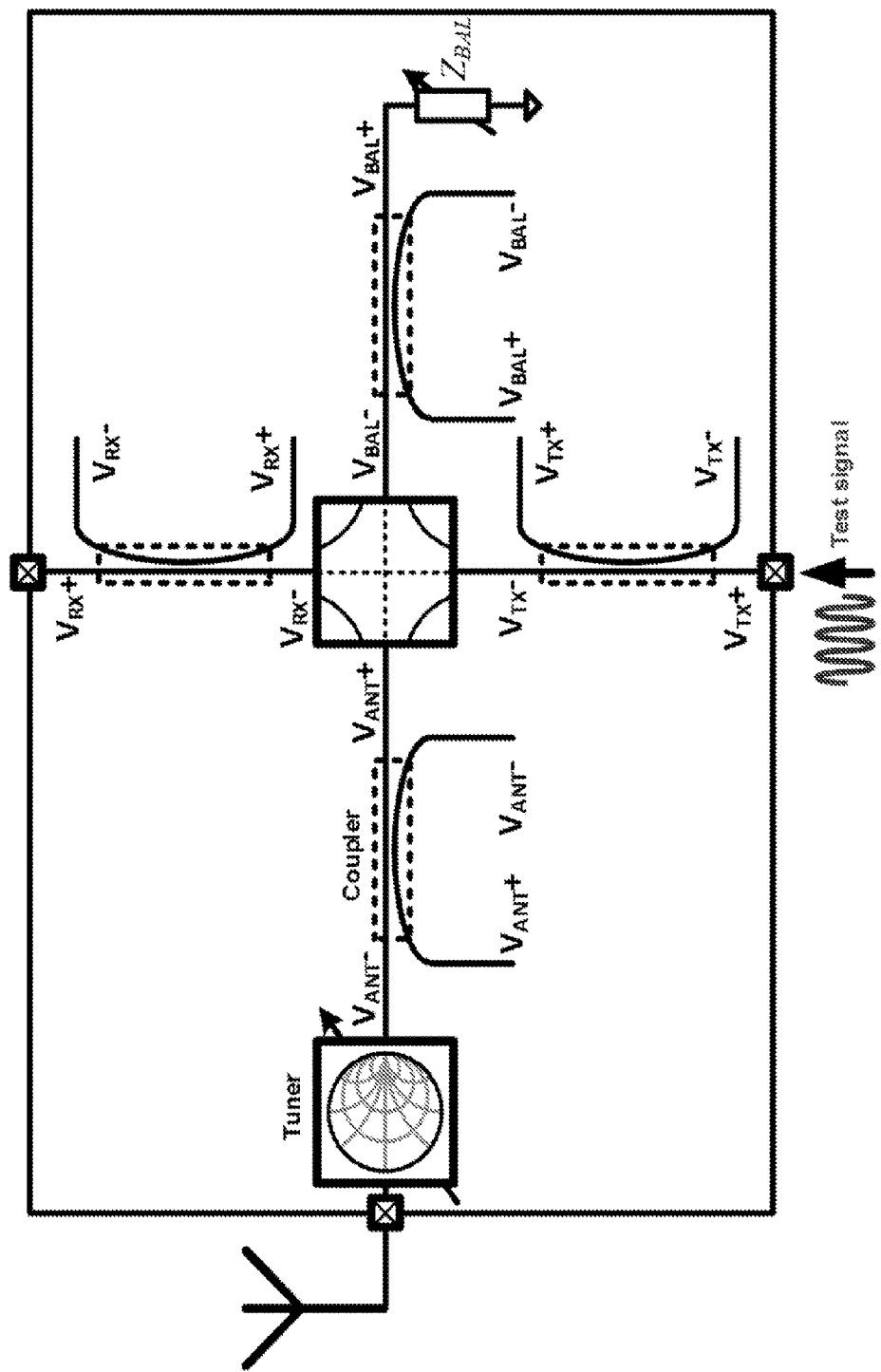
FIG. 2 shows a prior art tuning circuit for tuning the tunable impedance of an electrical balance duplexer of the state of the art.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Figure 3:
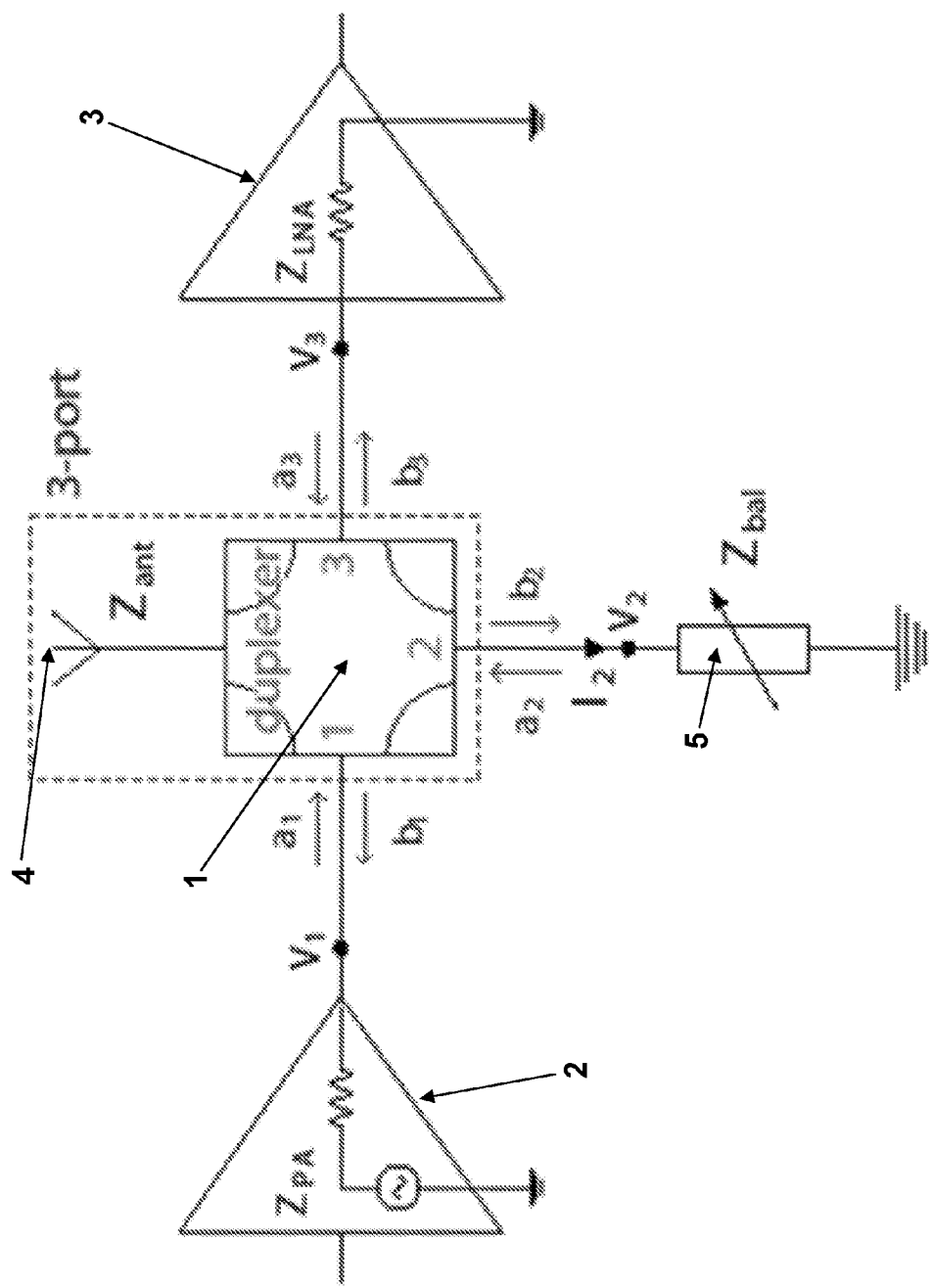
FIG. 3 shows an electrical balance duplexer assumed as a 3-port network.

FIG. 3 shows the electrical balance duplexer 1 when assuming that it is a 3-port network with the antenna 4 included in the S-parameter representation of the electrical balance duplexer 1. The reason for the inclusion of the antenna 4 is that we assume the antenna 4 to be an unknown impedance that also varies over time. In that case, the S-parameters describing all the transfer paths throughout the 3-port network are given as:

$$\begin{bmatrix} b_1 \\ b_2 \\ b_3 \end{bmatrix} = \begin{bmatrix} S_{11} & S_{12} & S_{13} \\ S_{21} & S_{22} & S_{23} \\ S_{31} & S_{32} & S_{33} \end{bmatrix} \begin{bmatrix} a_1 \\ a_2 \\ a_3 \end{bmatrix},$$

where the first port (PA/TX port) is the connection to the transmission path 2, the second port is the connection to the tunable impedance 5 (balance network $Z_{bal}$), and the third port (LNA/RX port) is the connection to the receive path 3.

The disclosure provides a tuning circuit 6 with a sensing method that derives the equations in order to calculate $Z_{bal}$ in real-time and provide automated tuning, using minimal hardware, for any antenna condition.

Figure 4:
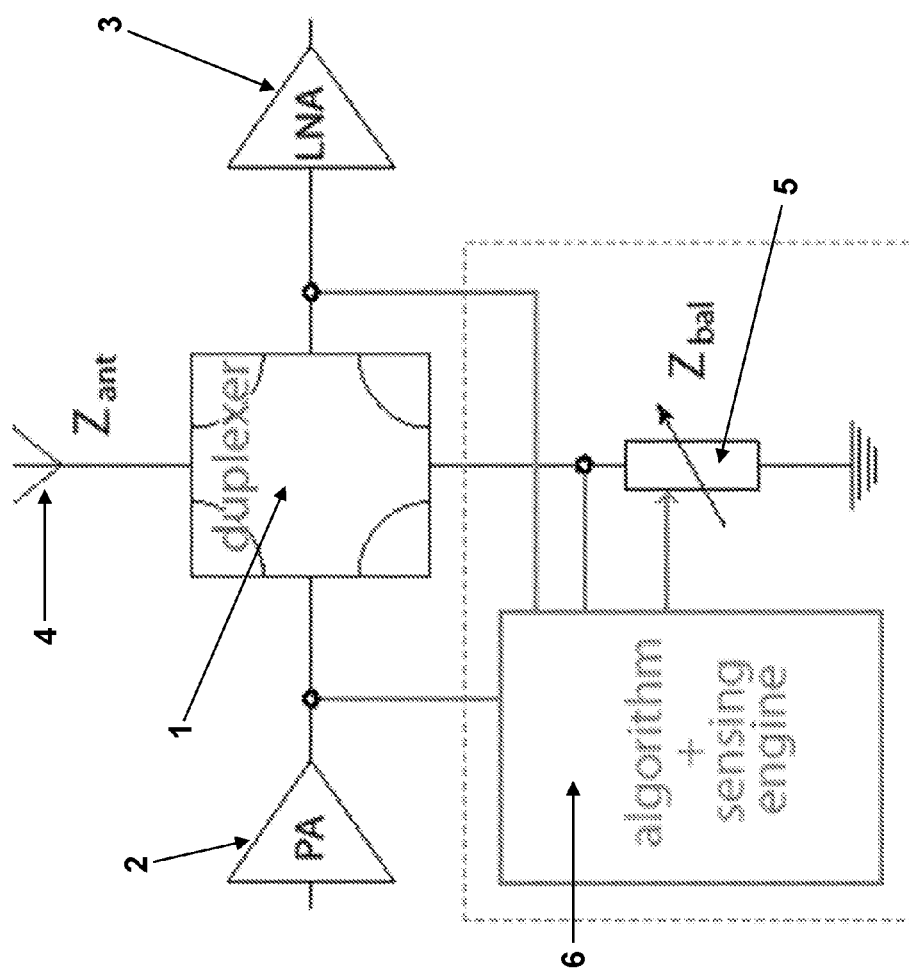
FIG. 4 shows a schematic representation of the electronics communication device, according to example embodiments.
Figure 5:
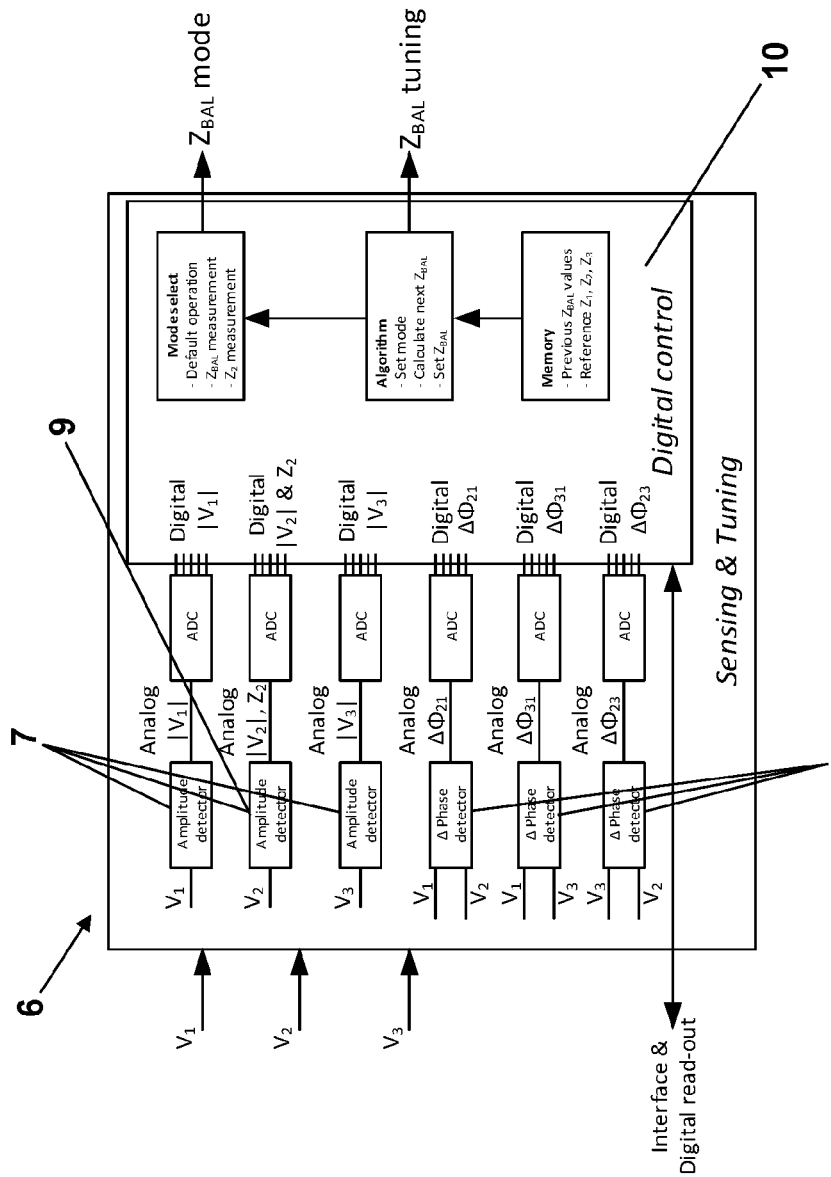
FIG. 5 shows a schematic representation of the tuning circuit of the electronic communication device, according to example embodiments.

As also already mentioned, considering the problem in a 3-port fashion helps to simplify the problem, and allows the use of less hardware. FIG. 4 shows the same 3-port network with a tuning circuit 6, of which more detail is shown in FIG. 5, connected to the three ports (in a schematic sense), and provides a closed-loop that tunes $Z_{bal}$ to achieve isolation. The embodiment assumes a test signal is available from the transmitter TX, and that an optimized $Z_{bal}$ exists for any signal frequency at which the transmitter TX is active.

In the case where all 9 S-parameters (the full matrix) would be known, it would be possible to calculate the associated $Z_{bal}$ for achieving isolation in the duplexer 1 in a single step. However, we solve the problem of finding $Z_{bal}$ in an iterative manner, with practically implementable (cheap, low-power, low-area, etc.) sensors on as little nodes as possible.

In particular, the algorithm uses the sensed information using detectors or sensors 7, 8, 9 at just the TX, RX and BAL ports, thus respectively the connections between the electrical balance duplexer 1 on the one hand and the transmission path 2, the receive path 3 and the tunable impedance 5 on the other hand, to solve the following equations derived from the S-parameter matrix to arrive at $Z_{bal}$, using only $S_{13}$, $S_{12}$, $S_{23}$ and $S_{22}$ (4 out of 9 parameters):

$$S_{13} + \frac{\Gamma_2 S_{12} S_{23}}{1 + S_{22}\Gamma_2} =$$

$$0 \Rightarrow \Gamma_2 = \frac{-S_{13}}{S_{12}S_{23} + S_{13}S_{22}} \Rightarrow \Gamma_2 = \frac{Z_{bal} - Z_0}{Z_{bal} + Z_0} \Leftrightarrow Z_{bal} = Z_0 \frac{1 + \Gamma_2}{1 - \Gamma_2}$$

where $S_{ij}$ is the S-parameter that describes the transfer from port i to j, and $\Gamma_i$ describes the so-called reflection coefficient, which is calculated from a limited amount of S-parameters (not all 9 are used). This directly limits the associated hardware to solve the equation.

Note that, although a first approximation of $Z_{bal}$ may already be calculated from the 4 S-parameters in a first calculation based on a single measurement from the detectors 7, 8, 9, the calculated $Z_{bal}$ may still not be optimized due to a number of assumptions on, for example, what the input and load impedances are on all ports. The provided equations are thus not always able to give a fully accurate answer for $Z_{bal}$ in a single calculation based on the detected information. Therefore, the algorithm is further optimized by iterating a number of times to improve upon possible differences or deviations caused by the assumptions in the equations.

In an example practical embodiment, amplitude sensors 7 can be used to observe amplitude or magnitude information at all nodes, and phase detectors 8 could be used to observe the phase information. Then, from that information, the set of 4 S-parameters can be derived, with simpler hardware.

In that case, the following equations may be solved first, before finally solving the equation for $Z_{bal}$ (as shown above).

$$S_{12} = \frac{\sqrt{\Re(Z_1)}}{\sqrt{\Re(Z_2)}} \frac{1}{2}\left(1 + \frac{Z_2^*}{Z_{bal}}\right) \frac{|V_2|}{|V_1|} e^{(\varphi_2 - \varphi_1)j}$$

$$S_{13} = \frac{\sqrt{\Re(Z_1)}}{\sqrt{\Re(Z_3)}} \frac{|V_3|}{|V_1|} e^{(\varphi_3 - \varphi_1)j}$$

$$S_{32} = \frac{\sqrt{\Re(Z_3)}}{\sqrt{\Re(Z_2)}} \frac{1}{2}\left(1 - \frac{Z_2}{Z_{bal}}\right) \frac{|V_2|}{|V_3|} e^{(\varphi_2 - \varphi_3)j}$$

$$S_{22} = \frac{Z_2 - Z_{bal}^*}{Z_2 + Z_{bal}}$$

Where j is the imaginary number operator, $Z_i$ is the impedance looking into the electrical balance duplexer, in this case a hybrid transformer, at port i, $|V_i|$ is the voltage amplitude detected at port i, $\Re(Z_i)$ is the real part of impedance $Z_i$ and $\varphi_i$ is the phase of the voltage at port i. Note that $S_{22}$ relates to $Z_2$ and $Z_2^*$, which is the input impedance of the electrical balance duplexer 1 at the connection between the electrical balance duplexer 1 and the tunable impedance 5, and thus the impedance seen when looking into the hybrid transformer 5 from the balance network port.

To arrive at these equations, it is assumed that the antenna impedance negligibly influences $Z_2$. It is also assumed that the tunable impedance $Z_{bal}$ is known or can be measured. It is also assumed that the impedance of the transmission path 2 is matched to the impedance of the electrical balance duplexer 1 at the connection between both, and that the impedance of the receive path 3 is matched to the impedance of the electrical balance duplexer 1 at the connection between both. Thus, the PA and LNA are matched to their respective ports. For example, if PA output impedance=25Ω, then $Z_1$=25Ω. And if LNA input impedance=100Ω, then $Z_3$=100Ω. It is also assumed that the network is reciprocal network. i.e. $S_{ij}$=$S_{ji}$. It is also assumed that the S-parameters between ports (e.g. $S_{ij}$ between port i and j) are simplified to be the transfer function of the output over the input signal. For example, $S_{31}$=$b_3$/$a_1$.

From these equations, it becomes clear that a necessary condition is that the impedance $Z_2$ should be known. With $Z_2$ being the input impedance looking into the electrical balance duplexer 1 at the BAL-port interface, i.e. the connection between the electrical balance duplexer 1 and the tunable impedance 5.

Figure 6:
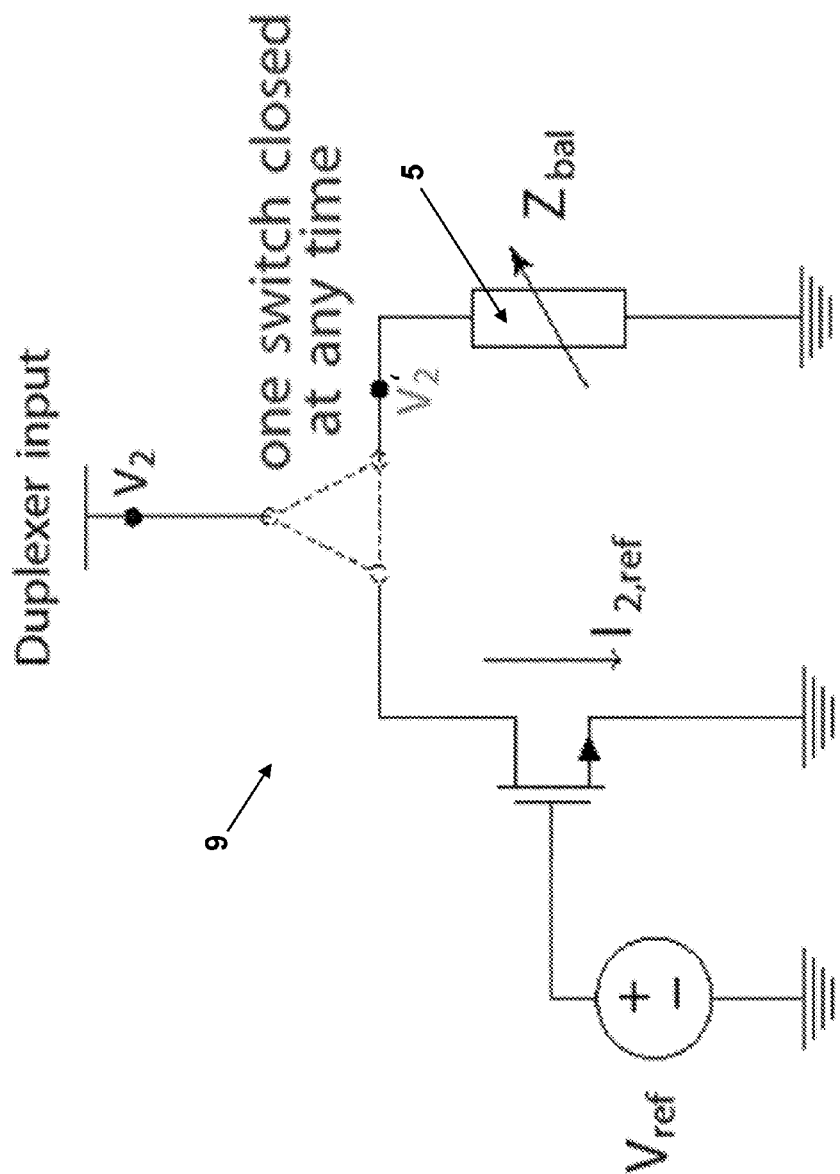
FIG. 6 shows an impedance detector of the electronics communication device, according to example embodiments.

FIG. 5 shows block level diagram of a tuning circuit of an electronic communication device according to an embodiment of the present disclosure. In this embodiment, analog voltages and phases at the ports of the EBD are measured by means of amplitude detectors 7, phase detectors 8 and an impedance detector 9 partially implemented by means of an amplitude detector 9 as shown in FIG. 6. The measured data is digitized by means of analog-to-digital converters ADC, and forwarded to the processing unit 10 where it is used for tuning the tunable impedance 5 according to an embodiment of the method of the present disclosure.

FIG. 6 shows an example impedance detector or sensor 9 that could be used to sense both $Z_2$ as well as provide a calibration engine for $Z_{bal}$ (a-priori to live operation), using a three-way switch and two voltage sensors (connected to terminals $V_2$ and $V_2'$). $V_{ref}$ is an RF voltage that could be derived from the transmitter, and operation for this test could be performed at low-power, i.e. tapped from prior to the PA.

Figure 7:
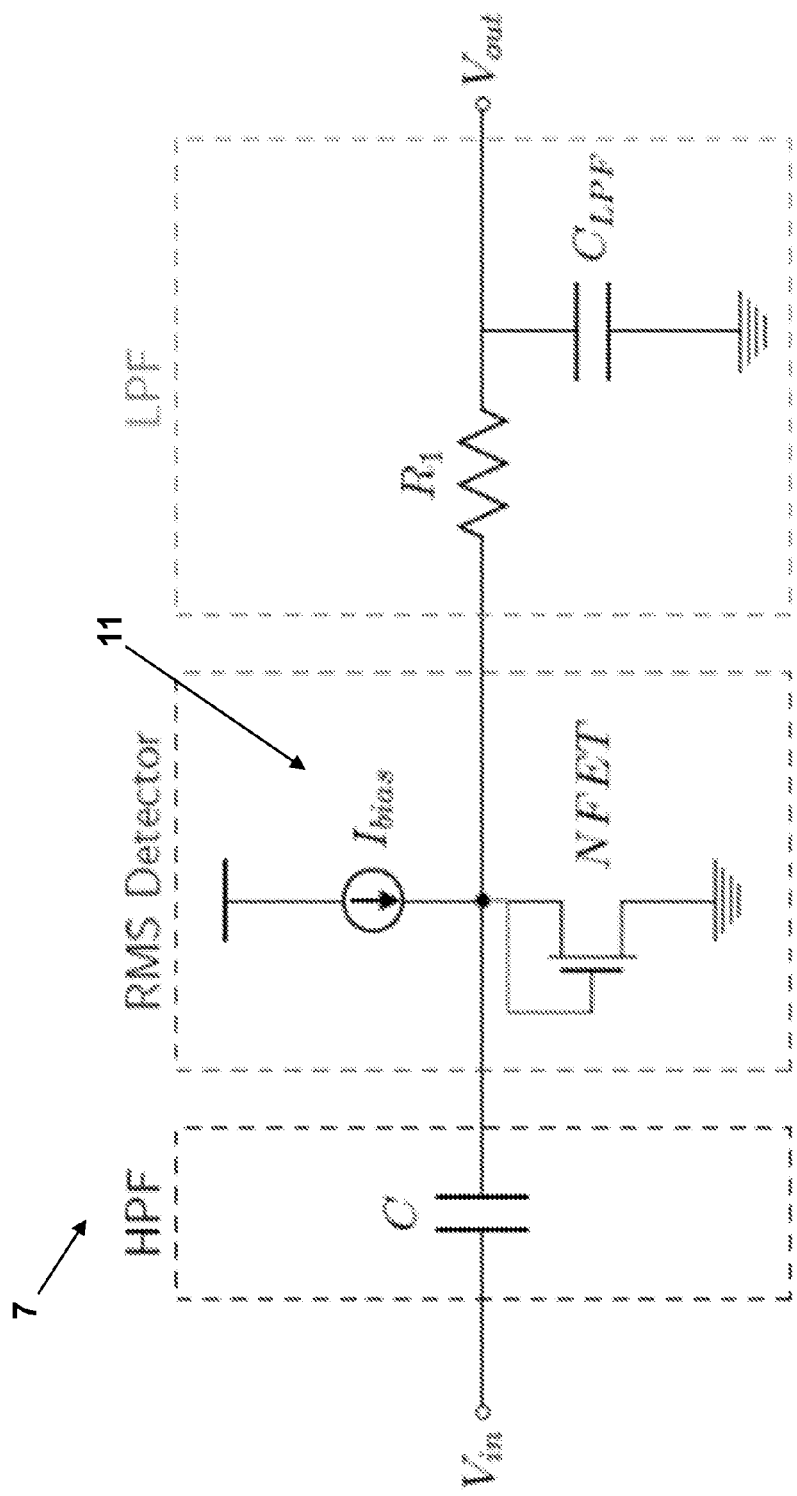
FIG. 7 shows an example implementation of an amplitude detector of the electronics communication device, according to example embodiments.
Figure 8:
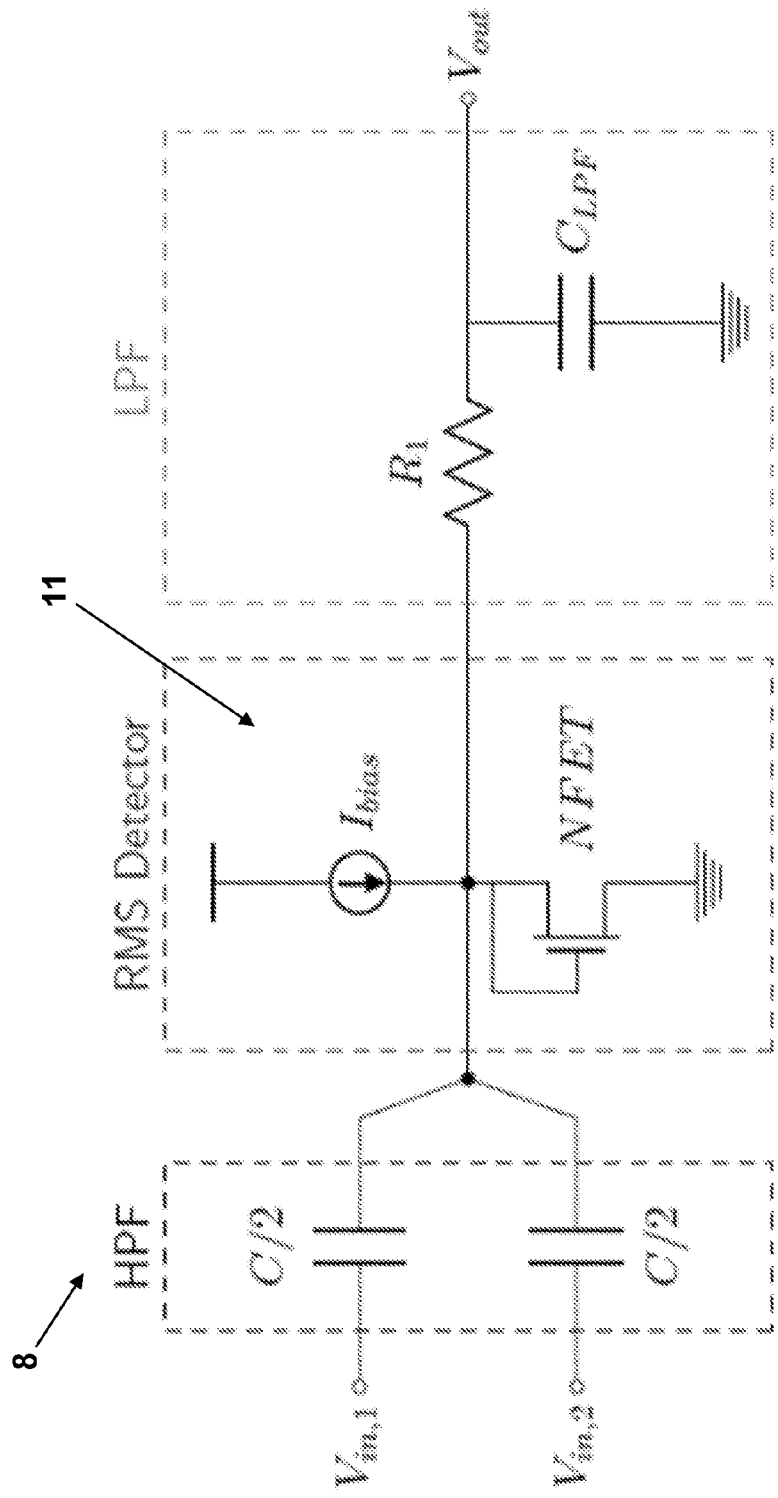
FIG. 8 shows an example implementation of a phase detector of the electronics communication device, according to example embodiments.

For each port, an amplitude (RMS) detector 7 (magnitude sensor) would be required. An implementation of one such magnitude sensor which could be used in the example diode-connected FET device shown in FIG. 7. Between two ports, a phase detector 8, such as for example shown in FIG. 8, could be used to measure the voltage phase difference $\varphi_i - \varphi_j$. It should however be clear that shown amplitude detectors 7 and phase detectors 8 are only example implementations, and different types of suitable detectors may be used.

Various mathematical assumptions and simplifications can be applied for the implementation of an algorithm that can arrive at a value for $Z_{bal}$ for any antenna impedance $Z_{ant}$ within 1.5:1 VSWR even when the detectors/sensors 7, 8, 9 exhibit up to 20% voltage error, 10 degrees phase error, and 20% error in $Z_2$. This is true even for a hybrid transformer 1 that is not symmetric, i.e. $Z_{BAL} \neq Z_{ANT}$. For example, typical hybrid transformer implementations use skewing to favor TX over RX loss, and have capacitive coupling which means that single-ended EBDs (FIG. 1) can have asymmetric values (by nature).

The algorithm, in pseudocode, operates as follows:

```
1:  put Z_bal(0) = 50 Ω
2:  evaluate Γ_2(0)
3:  evaluate Z_c(0) = Z_0 (1 - Γ_2(0))/(1 - Γ_2(0))
4:  put Z_bal(1) = Z_c(0)
5:  i = 1
6:  while S_13 < Threshold do         ▶ Ex.: Threshold = -50 dB
7:      evaluate Γ_2(i)
8:      evaluate Z_c(i)
9:      Corr = 50 Ω - Z_c(i)
10:     put Z_bal(i + 1) = Z_bal(i) - K * Corr    ▶ K = attenuation factor
11:     i++
```

In optimization, $Z_0$, the Threshold factor and attenuation factor K are found such that the algorithm finds $Z_{bal}$ in as low as possible iterations.

The method according to a further embodiment of the present disclosure thus comprises the steps of: setting the tunable impedance 5 to a predetermined initial value, e.g. 50Ω, calculating a reflection coefficient $\Gamma_2$ at the side of the electrical balance duplexer 1 connected to the tunable impedance 5 from values measured by the detectors 7, 8, 9 of the tuning circuit 6, calculating a first estimate of the optimized impedance value from the predetermined initial value of the tunable impedance 5 and the calculated reflection coefficient $\Gamma_2$, and setting the tunable impedance 5 to the first estimate of the optimized impedance value.

In some embodiments, the method further comprises the steps of: recalculating the reflection coefficient $\Gamma_2$, calculating an intermediate value of the optimized impedance value from the previous estimate of the optimized impedance value and the recalculated reflection coefficient $\Gamma_2$, calculating a correction term Corr by subtracting the calculated intermediate value from the predetermined initial value, calculating a further estimate of the optimized impedance value by subtracting the correction term Corr from the predetermined initial value, optionally after multiplying the correction term with an attenuation factor K, and setting the tunable impedance to the further estimate of the optimized impedance value. In some embodiments, these steps are iteratively repeated until the value of the scattering parameter $S_{13}$ from transmission path 2 to the receive path 3, which scattering parameter $S_{13}$ is calculated from measurements of the detectors 7, 8, 9 at the connections between the electrical balance duplexer 1 on the one hand and the transmission path 2 and the receive path 3 on the other hand, is smaller than a predetermined threshold value, below which threshold value the transmission path 2 is substantially isolated from the receive path 3.

What is claimed is:
1. A telecommunications device comprising:
   an electrical balance duplexer connected to an output node of a transmission path, an input node of a receive path, an antenna, and a tunable impedance, wherein the electrical balance duplexer is configured to isolate the transmission path from the receive path by tuning the tunable impedance; and
   a tuning circuit for tuning the tunable impedance,
   wherein the tuning circuit comprises:
      amplitude detectors for measuring voltage amplitudes at each of the connections between the electrical balance duplexer and the transmission path, between the electrical balance duplexer and the receive path, and between the electrical balance duplexer and the tunable impedance;
      phase detectors for measuring voltage phase differences between each of the connections between the electrical balance duplexer and the transmission path, between the electrical balance duplexer and the receive path, and between the electrical balance duplexer and the tunable impedance;
      an impedance sensor for measuring an input impedance of the electrical balance duplexer at the connection between the electrical balance duplexer and the tunable impedance; and
      a processing unit operatively connected to the amplitude detectors, the phase detectors, the impedance sensor, and the tunable impedance, wherein the processing unit is configured to:
         calculate an optimized impedance value from the voltage amplitudes, the voltage phase differences, and the input impedance of the electrical balance duplexer; and
         tune the tunable impedance towards the optimized impedance value.

2. The telecommunications device according to claim 1, wherein the processing unit is further configured to calculate the optimized impedance value from at least four scattering parameters between any two of the transmission path, the receive path, and the tunable impedance, wherein the scattering parameters are calculated from the voltage amplitudes, the voltage phase differences, and the input impedance.

3. The telecommunications device according to claim 1, wherein the processing unit is further configured to iteratively calculate the optimized impedance value and tune the tunable impedance towards the optimized impedance value.

4. The telecommunications device according to claim 1, wherein at least one of the detectors is implemented using a root mean square (rms) voltage detector.

5. The telecommunications device according to claim 1, wherein the impedance sensor is implemented using the amplitude detector at the connection between the electrical balance duplexer and the tunable impedance.

6. The telecommunications device according to claim 1, wherein the tuning circuit further comprises an analog-to-digital converter configured to digitize the voltage amplitudes, the voltage phase differences, and the input impedance.

7. A method for tuning a tunable impedance of a telecommunications device comprising an electrical balance duplexer connected to an output node of a transmission path, an input node of a receive path, an antenna, and the tunable impedance, wherein the electrical balance duplexer is configured to isolate the transmission path from the receive path by tuning the tunable impedance, the method comprising:
measuring voltage amplitudes at each of the connections between the electrical balance duplexer and the transmission path, between the electrical balance duplexer and the receive path, and between the electrical balance duplexer and the tunable impedance;
measuring voltage phase differences between each of the connections between the electrical balance duplexer and the transmission path, between the electrical balance duplexer and the receive path, and between the electrical balance duplexer and the tunable impedance;
measuring an input impedance of the electrical balance duplexer at the connection between the electrical balance duplexer and the tunable impedance;
calculating an optimized impedance value from the measured voltage amplitudes, the voltage phase differences, and the input impedance; and
tuning the tunable impedance towards the optimized impedance value.

8. The method according to claim 7, wherein the optimized impedance value is calculated from at least four scattering parameters between any two of the transmission path, the receive path, and the tunable impedance, and wherein the scattering parameters are calculated from the measured voltage amplitudes, the measured voltage phase differences, and the input impedance.

9. The method according to claim 7, wherein the steps of the method are iteratively repeated until a scattering parameter from the transmission path to the receive path is below a predetermined threshold value.

10. The method according to claim 7, wherein calculating an optimized impedance value from the measured voltage amplitudes, the voltage phase differences, and the input impedance, and tuning the tunable impedance towards the optimized impedance value are performed iteratively.

11. The method according to claim 7, wherein measuring the voltage amplitudes or measuring the voltage phase differences is performed using a root mean square (rms) voltage detector.

12. The method according to claim 7, wherein measuring the input impedance is performed using an amplitude detector at the connection between the electrical balance duplexer and the tunable impedance.

13. The method according to claim 7, further comprising digitizing the voltage amplitudes, the voltage phase differences, and the input impedance.

14. A tuned impedance for a telecommunications device comprising an electrical balance duplexer connected to an output node of a transmission path, an input node of a receive path, an antenna, and the tuned impedance, wherein the electrical balance duplexer is configured to isolate the transmission path from the receive path by tuning the tuned impedance, and wherein the tuned impedance is tuned according to a method comprising:
measuring voltage amplitudes at each of the connections between the electrical balance duplexer and the transmission path, between the electrical balance duplexer and the receive path, and between the electrical balance duplexer and the tuned impedance;
measuring voltage phase differences between each of the connections between the electrical balance duplexer and the transmission path, between the electrical balance duplexer and the receive path, and between the electrical balance duplexer and the tuned impedance;
measuring an input impedance of the electrical balance duplexer at the connection between the electrical balance duplexer and the tuned impedance;
calculating an optimized impedance value from the measured voltage amplitudes, the voltage phase differences, and the input impedance; and
tuning the tuned impedance towards the optimized impedance value.

15. The tuned impedance according to claim 14, wherein the optimized impedance value is calculated from at least four scattering parameters between any two of the transmission path, the receive path, and the tuned impedance, and wherein the scattering parameters are calculated from the measured voltage amplitudes, the measured voltage phase differences, and the input impedance.

16. The tuned impedance according to claim 14, wherein the steps of the method are iteratively repeated until a scattering parameter from the transmission path to the receive path is below a predetermined threshold value.

17. The tuned impedance according to claim 14, wherein calculating an optimized impedance value from the measured voltage amplitudes, the voltage phase differences, and the input impedance, and tuning the tuned impedance towards the optimized impedance value are performed iteratively.

18. The tuned impedance according to claim 14, wherein measuring the voltage amplitudes or measuring the voltage phase differences is performed using a root mean square (rms) voltage detector.

19. The tuned impedance according to claim 14, wherein measuring the input impedance is performed using an amplitude detector at the connection between the electrical balance duplexer and the tuned impedance.

20. The tuned impedance according to claim 14, wherein the method further comprises digitizing the voltage amplitudes, the voltage phase differences, and the input impedance.

* * * * *